United States Patent [19]
Allstot et al.

[11] Patent Number: 5,162,674
[45] Date of Patent: Nov. 10, 1992

[54] CURRENT-STEERING CMOS LOGIC FAMILY

[75] Inventors: David J. Allstot, Pittsburgh, Pa.; Guojin Liang, San Jose; Howard C. Yang, Milpitas, both of Calif.

[73] Assignee: State of Oregon Acting by and Through the State Board of Higher Education on Behalf of Oregon State University, Eugene, Oreg.

[21] Appl. No.: 698,672

[22] Filed: May 10, 1991

[51] Int. Cl.$^5$ ...................... H03K 17/16; H03K 19/20
[52] U.S. Cl. .................................... 307/451; 307/443; 307/475; 307/450
[58] Field of Search ........................ 364/600; 341/110; 307/443, 475, 451, 455, 450, 477, 459

[56] References Cited

U.S. PATENT DOCUMENTS

| | | | |
|---|---|---|---|
| 4,445,051 | 4/1984 | Elamsry | 307/450 |
| 4,661,725 | 4/1987 | Chantepie | 307/450 |
| 4,831,284 | 5/1989 | Anderson et al. | 307/450 |
| 4,939,390 | 7/1990 | Coe | 307/450 |

OTHER PUBLICATIONS

Horst H. Berger and Siegfried K. Wiedman, *Merged--Transistor Logic (MTL)-A Low-Cost Bipolar Logic Concept*, IEEE Journal of Solid-State Circuits, vol. SC-7, No. 5, Oct. 1972, pp. 340-346.

Kees Hart and Arie Slob, *Integrated Injection Logic: A New Approach to LSI*, IEEE Journal of Solid-State Circuits, vol. SC-7, No. 5, Oct. 1972, pp. 346-351.

Primary Examiner—Edward P. Westin
Assistant Examiner—Richard Roseen
Attorney, Agent, or Firm—Klarquist, Sparkman, Campbell, Leigh & Whinston

[57] ABSTRACT

In integrated circuitry having both analog and digital circuits fabricated on the same substrate, switching transients produced by the digital circuitry can propagate through the substrate and induce deleterious effects in the associated analog circuitry. Such switching transients are greatly minimized by the disclosed family of CMOS logic circuits in which a constant DC bias current is steered to change logic states.

22 Claims, 3 Drawing Sheets

CURRENT-STEERING CMOS LOGIC FAMILY

FIELD OF THE INVENTION

The present invention relates to integrated circuitry, and more particularly relates to a family of current-steering digital logic circuits that greatly minimizes switching current transients, thereby facilitating operation of digital and analog circuitry on common substrates.

BACKGROUND AND SUMMARY OF THE INVENTION

CMOS mixed-mode integrated circuits are a topic of increasing interest and importance. The present trend is towards mixed-mode monolithic systems containing higher frequency and higher accuracy analog circuitry combined with increasingly complex digital circuitry. Examples of such circuitry include 16-20 bit self-correcting successive-approximation converters and sigma-delta analog-to-digital (A/D) converters. The achievable accuracy of many such systems is now limited by the adverse effects of digital switching noise associated with conventional CMOS static logic circuitry. In the future, this problem will become proportionately worse at higher frequencies due to the unavoidable reduction in the power supply noise rejection capabilities of the analog circuitry at higher frequencies.

CMOS static logic is widely used because of its high packing densities, noise margins, and operating frequencies. Although a conventional CMOS logic gate ideally dissipates zero static power, a large overlap current pulse (~1 mA/gate) flows from $V_{dd}$ to GND during its state transition. Large current pulses flowing through the inductances and resistances associated with the substrate, power supply lines, bonding wires, package pins, etc., typically cause 1 volt or more of switching noise on the $V_{dd}$ and GND lines. The accuracy of mixed-mode ASIC's is often limited by the coupling of the switching noise into the analog circuitry that shares the same substrate (FIG. 9).

One way to increase the accuracy of mixed-mode ASIC's is to increase the power supply noise rejection capabilities of the analog circuitry. With fully-differential analog architectures, power supply noise appears as a common-mode signal that is rejected by the common-mode-rejection-ratio (CMRR). However, CMRR usually decreases in direct proportion to increases in frequency.

A reduction in the transmission of digital switching noise between the digital and analog subsections may be obtained by using guardbanding and/or power supply separation techniques. Separate analog and digital power supply lines are used to minimize the common impedance.

Further success in reducing the transmission of switching noise between the analog and digital subsections is determined by the nature of the power supply connections to the substrate. When laying out digital cells using a p-well CMOS technology, it is common practice to incorporate within each cell several n+ ohmic contacts from the digital $V_{dd}$ supply line to the substrate to deter latch-up. Hence, switching noise associated with digital $V_{dd}$ is unavoidably coupled directly into the analog circuitry via the common substrate.

Significant increases in the accuracy of mixed-mode systems may also be achieved by reducing the amount of switching noise generated by the digital logic. The switching noise associated with conventional logic originated with the overlap current pulses generated during transitions. More precisely, the switching noise arises because the power supply currents are not constant. One way to implement logic circuits with constant supply currents is to use MOS differential pairs to switch constant current sources. Such a technique is disclosed in copending application Ser. No. 07/693,532 entitled MOS Folded Source-Coupled Logic. Although this approach achieves low power-supply noise, it requires several additional transistors per gate, and the MOSFETs are required to have large W/L ratios at high frequencies.

In accordance with the present invention, switching current transients in mixed mode circuitry are greatly minimized by use of source-coupled differential CMOS logic circuits wherein a constant DC bias current is steered to change logic states. Internal voltage swings are typically less than one volt. Consequently, measured power supply ($V_{dd}$) current spikes are typically only 15 $\mu$A for current steering inverter implemented in a 2 $\mu$m p-well CMOS technology—a reduction of two orders of magnitude compared to the 1.5 mA current spikes typical of a conventional static CMOS inverter. The reduction in digital switching noise allows the development of higher performance on-chip analog circuitry in CMOS mixed-mode applications.

The foregoing and additional features and advantages of the invention will be more readily apparent from the following detailed description, which proceeds with reference to the accompanying drawings.

DETAILED DESCRIPTION

Figure 1A:
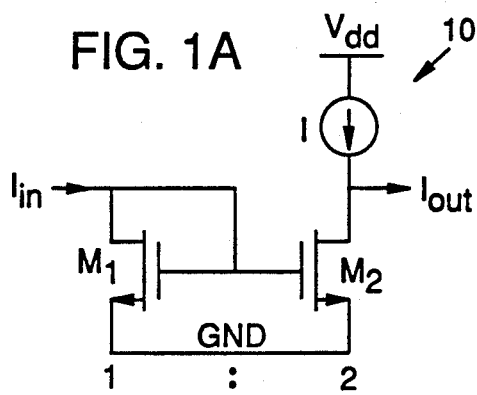
FIG. 1A is a schematic diagram of a MOS inverter according to one embodiment of the present invention.

Referring first to FIG. 1A, the operation of a first form of a current steering MOS (ISMOS) logic circuit 10 according to the present invention is premised on the use of currents, rather than voltages, to represent the logic signals. Assuming that the circuit 10 shown drives an identical stage, and that $(W/L)_2 = 2(W/L)_1$, then $I_{in}=I$ gives $I_{out}=0$ and $I_{in}=0$ results in $I_{out}=I$. Hence, this circuit functions as a current-mode inverter without requiring a differential pair for current switching. Moreover, the total current drawn from the power supply is constant, I. The internal voltage swings associated with the current logic levels are typically designed to be 500 mV to 1 Volt.

Figure 2:
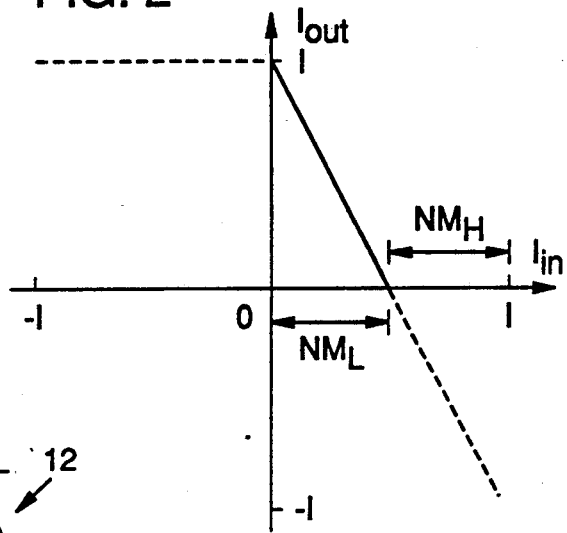
FIG. 2 is a graph depicting the DC transfer characteristic of the inverter of FIG. 1A as a function of applied input current.
Figure 1B:
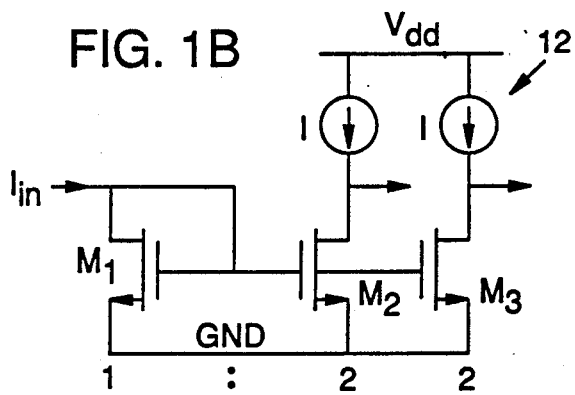
FIG. 1B is a schematic diagram of the MOS inverter of FIG. 1A adapted for a fanout of 2.

One drawback of this implementation of ISMOS logic is that each fanout requires an identical output branch, as illustrated by the inverter 12 with fanout=2 shown in FIG. 1B. A DC transfer characteristic for the ISMOS inverter of FIG. 1A is shown in FIG. 2. It can easily be shown that equal high ($NM_H$) and low ($NM_L$) noise margins equal to I/2 are obtained by choosing $(W/L)_2 = 2(W/L)_1$. These ratios, of course, can be varied with corresponding changes in the noise margins.

Figure 3:
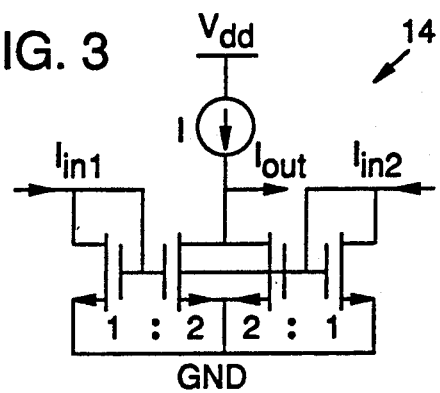
FIG. 3 is a schematic diagram of a MOS two-input NOR gate according to another embodiment of the present invention.
Figure 4:
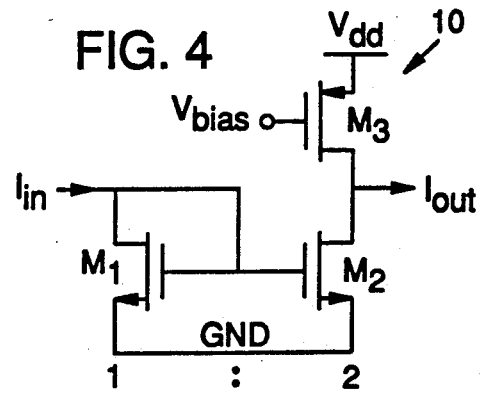
FIG. 4 is a more detailed schematic diagram of the MOS inverter of FIG. 1A detailing one form of a suitable constant current source.

A two-input (with fanout=1 capability) current-mode ISMOS NOR gate 14 is shown in FIG. 3, and a complete ISMOS inverter 10 is shown in FIG. 4. The constant current source load is here realized with a saturated PMOS device. $V_{bias}$ is derived as part of a simple p-channel current-mirror circuit with bias current I. This form of ISMOS may be recognized to be somewhat reminiscent of bipolar integrated injection logic ($I^2L$) as disclosed in Berger, H. et al, "Merged-Transistor Logic (MTL)—A Low-Cost Bipolar Logic Concept," *IEEE J. Solid-State Circuits*, vol. SC-7, pp. 340–346, Oct. 1972, and Hart, K. et al, "Integrated Injection Logic: A New Approach to LSI," *IEEE J. Solid-State Circuits*, vol. SC-7, pp. 346–351, Oct. 1972.

The power supply current spikes in ISMOS arise from two different mechanisms. Referring to FIG. 4, if driving an identical stage, as $I_{out}$ varies from 0 to I, the output voltage varies from $V_T$ to $\{V_T+[2I/k_n'(W/L)_1]^{\frac{1}{2}}\}$. The total voltage swing, $\Delta V$, is typically 0.5 to 1 Volt. As the output voltage varies, the bias current supplied by $M_3$ varies by an amount approximately equal to $\lambda(\Delta V)I$ due to the channel-length modulation effect on $M_3$. The size of this supply current variation is typically about 0.03I for a 2 $\mu$m CMOS technology. The use of a cascode PMOS current-source load to eliminate this source of noise is under investigation.

The fundamental source of power supply current spikes in ISMOS is the displacement current ($i = C\, dV_{out}/dt$) associated with charging and discharging the 'supply capacitances' associated with the output node. Supply capacitances are defined as the total capacitances between the output node and $V_{dd}$($C_{dd}$) or GND ($C_{GND}$). The rate of change of the output voltage is approximately $$dV_{out}/dt = I/C_{out} \quad (1)$$

where from FIG. 4, (driving an identical stage)

$$C_{out} = C_{gs1} + C_{gb1} + C_{db1} + C_{gs2} + C_{gb2} + C_{gd2} + C_{db2} + C_{db3} + C_{sb3}. \quad (2)$$

The displacement current spike into $V_{dd}$ is given by $$i_{dd} = C_{dd}\, dV_{out}/dt = (C_{db3}/C_{out})I \quad (3)$$

and the current spike into GND is $$i_{GND} = C_{GND}\, dV_{out}/dt = (C_{gs1} + C_{gb1} + C_{db1} + C_{gs2} + C_{gb2} + C_{db2}/C_{out})I. \quad (4)$$

In a representative embodiment, a p-well CMOS technology is used, and therefore the substrate must be directly connected to the digital $V_{dd}$ power supply to deter latch-up. Equations (3) and (4) suggest that $V_{dd}$ current spikes can be minimized by connecting the constant current sources to $V_{dd}$ as shown in FIG. 4. Although equation (4) predicts that the GND spikes may be relatively large, they flow only in the digital GND line which is not directly connected to the substrate in a p-well design. Therefore, GND noise does not adversely affect the analog circuitry by directly coupling through the substrate.

Since a constant current is switched in an ISMOS gate, it can be shown that for a given DC bias current, the speed of the gate is increased by decreasing the capacitance of the switching transistors. Hence, the performance of ISMOS will continue to improve as CMOS technology is scaled to smaller feature sizes.

A disadvantage of ISMOS in comparison to conventional CMOS logic is that it dissipates static power. However, the dynamic power ($C\Delta V^2 f$) of ISMOS is much smaller than that of conventional CMOS logic due to the much smaller logic swing. Hence, ISMOS actually dissipates less total power at higher frequencies than static logic. The bias current of ISMOS can be varied to minimize the total power dissipation for a given frequency of operation.

The efficacy of the disclosed technique has been verified by integrating several prototype circuits using MOSIS 2 $\mu$m p-well CMOS technology. An exemplary circuit is a 49-stage ring oscillator with various fanouts.

Figure 5:
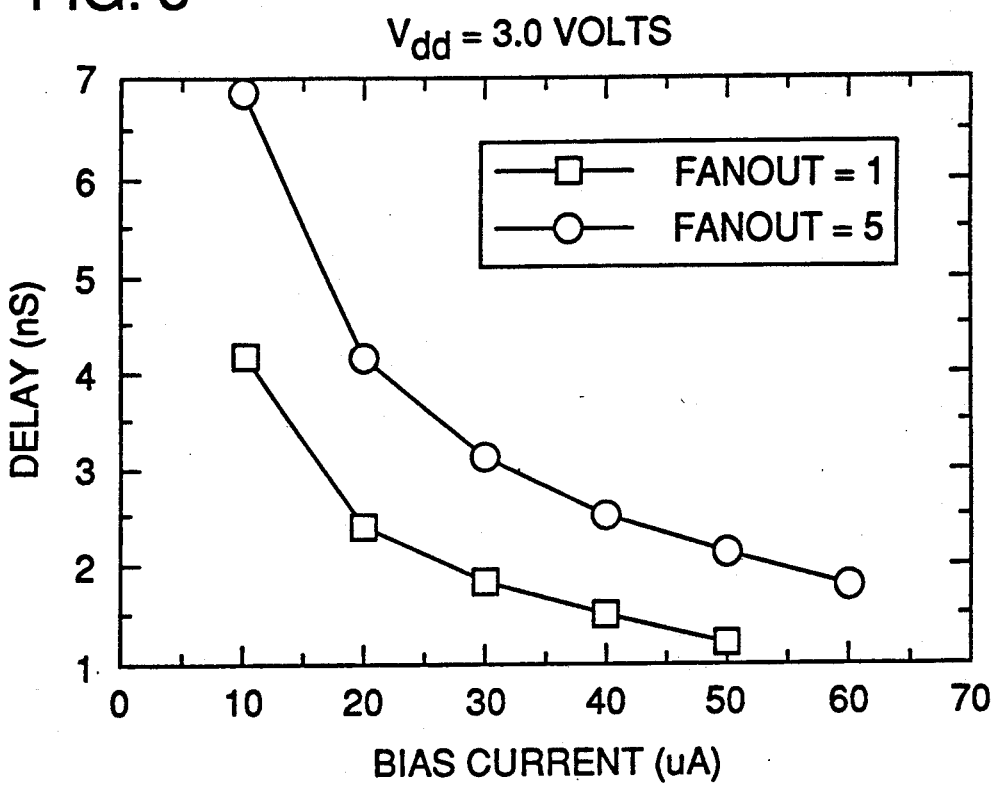
FIG. 5 is a graph depicting the power-delay performance of a logic circuit according to the present invention as a function of bias current with a $V_{dd}$ voltage of 3 volts.
Figure 6:
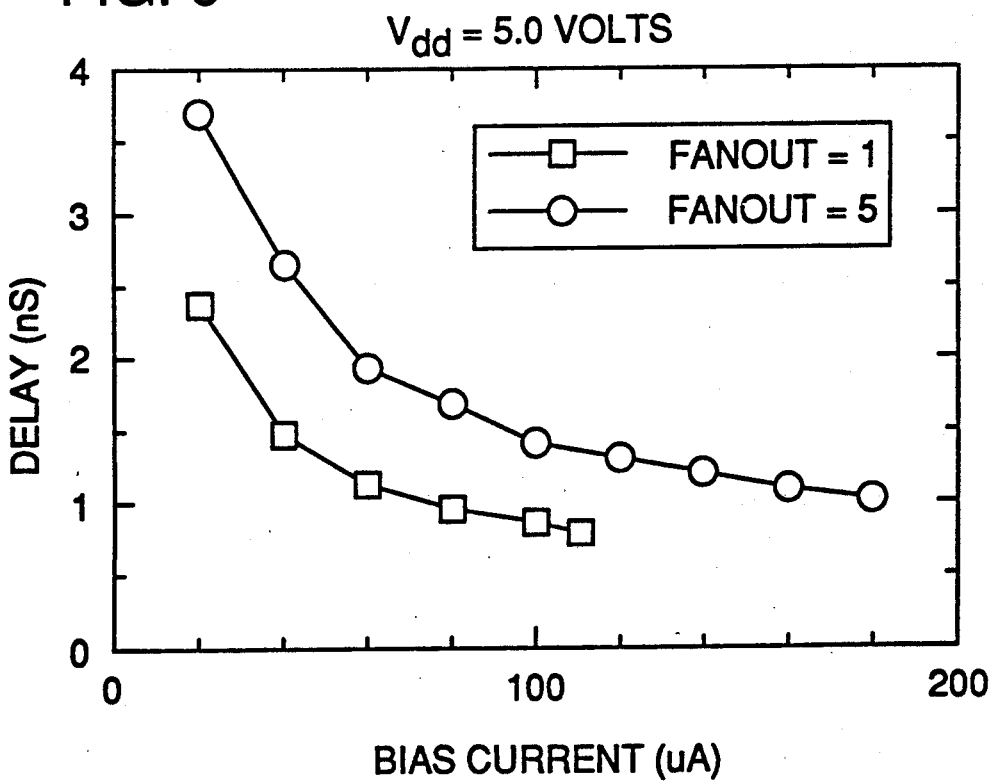
FIG. 6 is a graph like that of FIG. 5 but with a $V_{dd}$ voltage of 5 volts.

A key advantage of ISMOS is that it generates small power supply current spikes. The measured $V_{dd}$ power supply current spikes in the fabricated ring oscillator show the square-wave component due to the channel-length modulation effects on the PMOS current source to be about 2 $\mu$A peak, and the glitch component due to the displacement currents flowing in the supply capacitances to be about 3 $\mu$A peak. The measured power-delay performance for the 49-stage ISMOS ring oscillator is shown in FIGS. 5 and 6 for $V_{dd}=3.0$ and 5.0 volts. At higher currents, the minimum propagation delay has been measured at about 500 pS for the ring oscillator with fanout=1.

From the foregoing, it will be recognized that ISMOS is well suited to high-precision high-speed mixed-mode ASIC applications. By steering a constant current from the $V_{dd}$ power supply, the internal voltage swings are typically less than a volt. Hence, the power supply current spikes are only about 15 $\mu$A compared to more than a mA in a conventional static CMOS gate. The reduction in power supply current spikes translates to increased accuracy in the analog subsections of mixed-mode ASIC's. A minimum propagation delay of 500 pS with a power-delay product of 0.35 pJ was obtained early prototypes implemented in a 2 $\mu$m p-well CMOS technology. These prototypes have also been successfully tested using a 3 volt power supply.

Having described and illustrated the principles of our invention with reference to a preferred embodiment, it will be apparent that the invention can be modified in arrangement and detail without departing from such principles. For example, while the invention has been illustrated with reference to CMOS transistors, it will be recognized that the invention may find applicability with other fabrication technologies, some of which are not yet presently known. Similarly, while the invention has been illustrated with reference to representative logic circuits, namely an inverter and a two-input NOR gate, it will be recognized that the invention may similarly be applied to a variety of other arithmetic and logic circuits. Still further, while the invention has been particularly illustrated with reference to embodiments employing p-well CMOS technology, it should be apparent that transposition of device types can readily be achieved with only minor changes.

Figure 7:
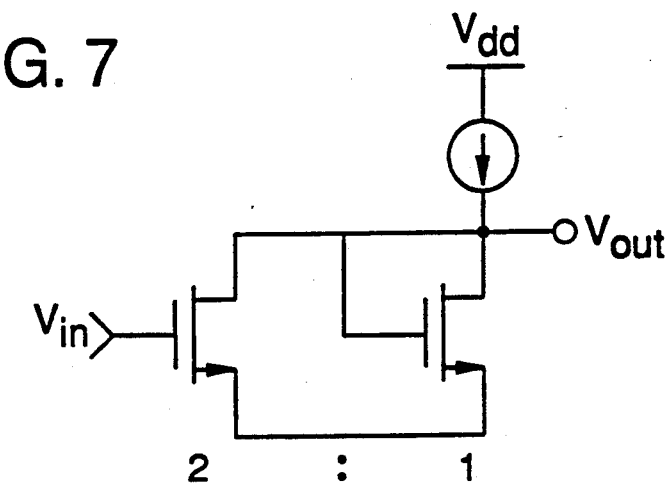
FIG. 7 is a schematic diagram of an inverter like that of FIG. 1A but arranged in a voltage-mode topology.
Figure 8:
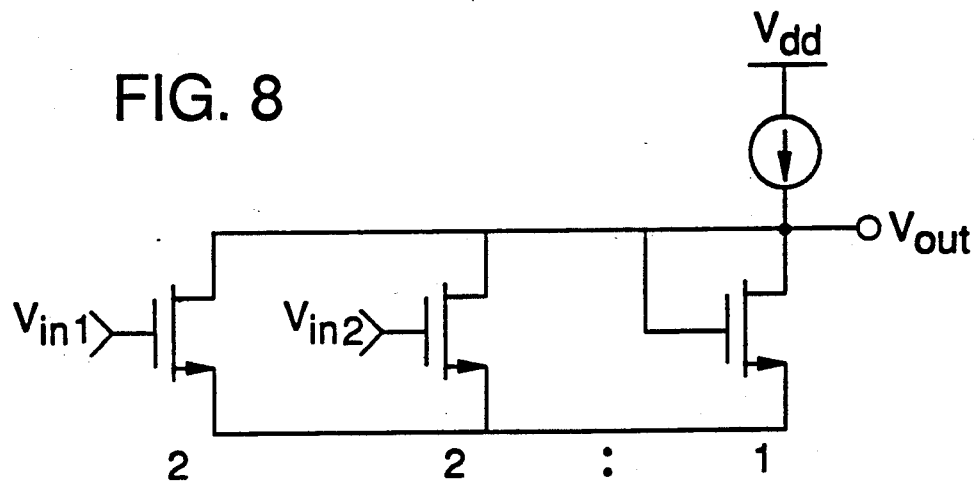
FIG. 8 is a schematic diagram of a two-input NOR gate like that of FIG. 3 but arranged in a voltage-mode topology.
Figure 9:
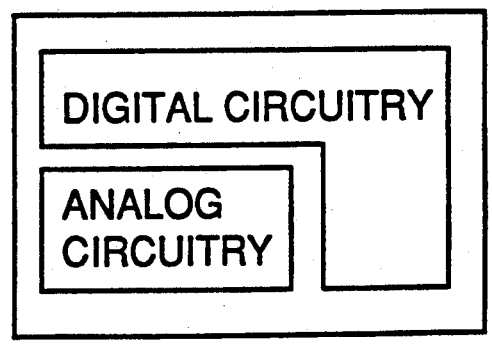
FIG. 9 shows an integrated circuit having both digital and analog circuitry on a common substrate.

To illustrate some of the other forms the present invention may take, consider FIGS. 7 and 8. FIG. 7 shows an inverter akin to that of FIG. 1A. FIG. 8 shows a two-input NOR gate akin to that of FIG. 3. However, instead of using currents to represent different logic states (as were used in FIGS. 1A and 3), the topologies of FIGS. 7 and 8 permit voltages to represent different logic states. Such circuits may be termed voltage-mode ISMOS, as opposed to the current-mode circuits of FIGS. 1-4.

In view of the wide variety of embodiments to which the principles of our invention may be applied, it should be apparent that the detailed embodiments are illustrative only and should not be taken as limiting the scope of our invention. Rather, we claim as our invention all such modifications as may come within the scope and spirit of the following claims and equivalents thereto.

We claim:

1. A mixed mode integrated circuit comprising:
   a substrate;
   one or more analog circuits fabricated on said substrate; and
   one or more digital circuits fabricated on said substrate;
   at least one of said digital circuits comprising:
   a CMOS input transistor;
   a CMOS output transistor;
   first and second power lines;
   a constant current source;
   the sources of the input and output transistors being connected together and coupled to the second power line;
   the gate of the input transistor being connected to a digital circuit input terminal;
   the gate of the output transistor being connected to the drain of the input transistor;
   the drain of the output transistor being connected to a digital circuit output terminal;
   the drain of the output transistor being coupled to the first power line through the constant current source; and
   the drain of the input transistor being connected to one of either the digital input terminal or the digital output terminal;
   wherein switching currents from the digital circuits are prevented from generating large noise spikes.

2. The integrated circuit of claim 1 which further includes:
   a second MOS transistor; and
   a second digital circuit input terminal;
   wherein:
   the drain of the second transistor is connected to the drain of the first output transistor;
   the source of the second transistor is connected to the source of the first output transistor; and
   the gate of the second transistor is connected to the second digital circuit input terminal.

3. The integrated circuit of claim 2 in which the gates of the input and output transistors are connected together.

4. The integrated circuit of claim 3 in which a width-to-length ratio of the input transistor is different than that of the output transistor.

5. The integrated circuit of claim 4 in which the width-to-length ratio of the output transistor is approximately twice that of the input transistor.

6. The integrated circuit of claim 1 in which the gates of the input and output transistors are connected together.

7. The integrated circuit of claim 6 in which a width-to-length ratio of the input transistor is different than that of the output transistor.

8. The integrated circuit of claim 7 in which the width-to-length ratio of the output transistor is approximately twice that of the input transistor.

9. The integrated circuit of claim 2 in which the gate and drain of the output transistor are connected together.

10. The integrated circuit of claim 9 in which a width-to-length ratio of the output transistor is different than that of the input transistor.

11. The integrated circuit of claim 10 in which the width-to-length ratio of the input transistor is approximately twice that of the output transistor.

12. The integrated circuit of claim 1 in which the gate and drain of the output transistor are connected together.

13. The integrated circuit of claim 12 in which a width-to-length ratio of the output transistor is different than that of the input transistor.

14. The integrated circuit of claim 13 in which the width-to-length ratio of the input transistor is approximately twice that of the output transistor.

15. A MOS logic circuit featuring reduced switching currents, the circuit comprising:
   a MOS input transistor;
   a MOS output transistor;
   first and second power lines;
   a constant current source;
   the sources of the input and output transistors being connected together and coupled to the second power line;
   the gates of the input and output transistors being connected together and connected to the drain of the input transistor, the drain of the input transistor defining an input terminal; and
   the drain of the output transistor being coupled to the first power line through the constant current source and defining an output terminal;
   wherein switching currents are prevented from generating large noise spikes.

16. The logic circuit of claim 15 in which a width-to-length ratio of the output transistor is different than that of the input transistor.

17. The logic circuit of claim 15 which further includes:
   a plurality N of MOS output transistors;
   N constant current sources;
   N output terminals;
   the sources of the input transistor and of all of the output transistors being connected together and coupled to the second power line;
   the gates of the input transistor and of all of the output transistors being connected together and connected to the drain of the input transistor;
   the drain of each output transistor being coupled to the first power line through one of said N constant current sources and defining one of said N output terminals.

18. The logic circuit of claim 17 in which a width-to-length ratio of a plurality of the output transistors is different than that of the input transistor.

19. The logic circuit of claim 15 which further includes:
a second MOS input transistor;
a second MOS output transistor;
the sources of the second input and output transistors being connected together and connected to the sources of the first input and output transistors;
the gates of the second input and output transistors being connected together and connected to the drain of the second input transistor, the drain of the second input transistor defining a second input terminal;
the drain of the second output transistor being connected to the drain of the first output transistor.

20. A MOS logic circuit featuring reduced switching currents, the circuit comprising:
a MOS input transistor;
a MOS output transistor;
first and second power lines;
a constant current source;
the sources of the input and output transistors being connected together and coupled to the second power line;
the drains of the input and output transistors being connected together and to the gate of the output transistor and defining a voltage-mode output terminal, said connected drains being coupled to the first power line through the constant current source;
the gate of the input transistor defining a voltage mode input terminal;
wherein switching currents are prevented from generating large noise spikes.

21. The logic circuit of claim 20 in which a width-to-length ratio of the input transistor is different than that of the output transistor.

22. The logic circuit of claim 20 which further includes:
a second MOS input transistor;
the source of the second input transistor being connected to the source of the first input transistor;
the drain of the second input transistor being connected to the drain of the first input transistor;
the gate of the second input transistor defining a second voltage mode input terminal.

* * * * *